United States Patent [19]
Andersson et al.

[11] Patent Number: 5,229,614
[45] Date of Patent: Jul. 20, 1993

[54] METHOD OF COUPLING RADIATION IN AN INFRARED DETECTOR, AND AN ARRANGEMENT HEREFOR

[75] Inventors: Jan Andersson, Solna; Lennart Lundqvist, Kista, both of Sweden

[73] Assignee: IM Institutet För Mikroelektronik, Kista, Sweden

[21] Appl. No.: 858,519

[22] Filed: Mar. 27, 1992

[30] Foreign Application Priority Data

Apr. 8, 1991 [SE] Sweden .................. 9101034-8

[51] Int. Cl.$^5$ ............................................ H01L 27/14
[52] U.S. Cl. ............................ 250/370.12; 250/338.4
[58] Field of Search ............ 250/370.12, 338.4, 370.01

[56] References Cited

U.S. PATENT DOCUMENTS

| | | | |
|---|---|---|---|
| 3,444,381 | 5/1969 | Wendland | 250/338.4 |
| 3,487,223 | 12/1969 | St. John | 250/338.4 |
| 5,026,148 | 6/1991 | Wen et al. | 359/483 |
| 5,075,749 | 12/1991 | Chi et al. | 357/16 |

*Primary Examiner*—Carolyn E. Fields
*Attorney, Agent, or Firm*—Nies, Kurz, Bergert & Tamburro

[57] ABSTRACT

A method for coupling radiation in an infrared detector of the kind which uses quantum wells that are comprised of thin layers of, e.g., gallium arsenide (GaAs) surrounded by aluminum gallium arsenide (AlGaAs). The invention is characterized in that a two-dimensional crossed grating (6), a so-called 2-D grating, is constructed on the top of the detector mesa of the detector on the side opposite the surface through which incident light (5) enters the detector. The grating (6) is caused to spread the incident light in different directions. According to one preferred embodiment, the detector also includes a cladding layer (14) which, together with the crossed grating, forms a wave guide.

15 Claims, 2 Drawing Sheets

METHOD OF COUPLING RADIATION IN AN INFRARED DETECTOR, AND AN ARRANGEMENT HEREFOR

The present invention relates to a method of coupling radiation in an infrared detector, and an arrangement herefor.

BACKGROUND OF THE INVENTION

Long-wave infrared detectors based on quantum wells have been found to be extremely responsive and efficient. The performance of such infrared detectors is close to that achieved with commercial mercad-detectors, i.e. mercury cadmium telluride-detectors. The wavelength response is a narrowband response, and can be selected between 3 and 15 micrometers.

Infrared detectors, IR-detectors, which use quantum wells are comprised of a thin layer of, e.g., gallium arsenide (GaAs) surrounded by aluminium gallium arsenide (AlGaAs). The most common type of IR-detector comprises 50 such quantum wells, each having a thickness of about 5 mm.

When infrared radiation of the correct energy impinges on the detector, electrons are excited to a state in which they can move readily from quantum well to quantum well, causing current to flow. The wavelength at which the detector has its maximum response may be varied intentionally, by appropriate choice of the dimensions and chemical composition of the quantum wells.

The most common detector is photoconductive. It is also possible, however, to manufacture photovoltaic detectors.

Quantum well detectors are either manufactured in accordance with the MOVPE-technique (metal organic gasphase epitaxy) or in accordance with MBE-technique (molecular beam epitaxy).

One serious problem common to quantum well detectors that are based on so-called intersub band transitions in the conductor band is that they are sensitive solely to IR-radiation whose electrical field vector has a component which is perpendicular to the quantum-well plane. This limits the degree of quantum efficiency and renders the majority of detector configurations sensitive to polarization. In particular, the detector is not sensitive, or responsive, to radiation which is incident perpendicular to the quantum-well layer.

SUMMARY OF THE INVENTION

The present invention solves this problem and provides a technique where the detector has a high degree of quantum efficiency, irrespective of the angle of the incident radiation, and where the detector is not sensitive to the polarization direction of the radiation.

Thus, the present invention relates to a method for coupling radiation in an infrared detector of the type which uses quantum wells that are comprised of thin layers of, e.g., gallium arsenide (GaAs) surrounded by aluminium gallium arsenide (AlGaAs), and is characterized in that a two-dimensional reflection grating, a so-called crossed grating, is formed in the top of the mesa of the detector, i.e. the quantum-well structure of the detector, on the side opposite to the surface through which incident light enters the detector, said grating causing the incident light to spread in different directions.

The invention also relates to an infrared detector constructed in the manner recited in the preceding paragraph.

BRIEF DESCRIPTION OF THE DRAWING

The invention will now be described in more detail, partly with reference to an exemplifying embodiment thereof illustrated in the accompanying drawing, in which.

DESCRIPTION OF THE PREFERRED EMBODIMENTS

Figure 1:
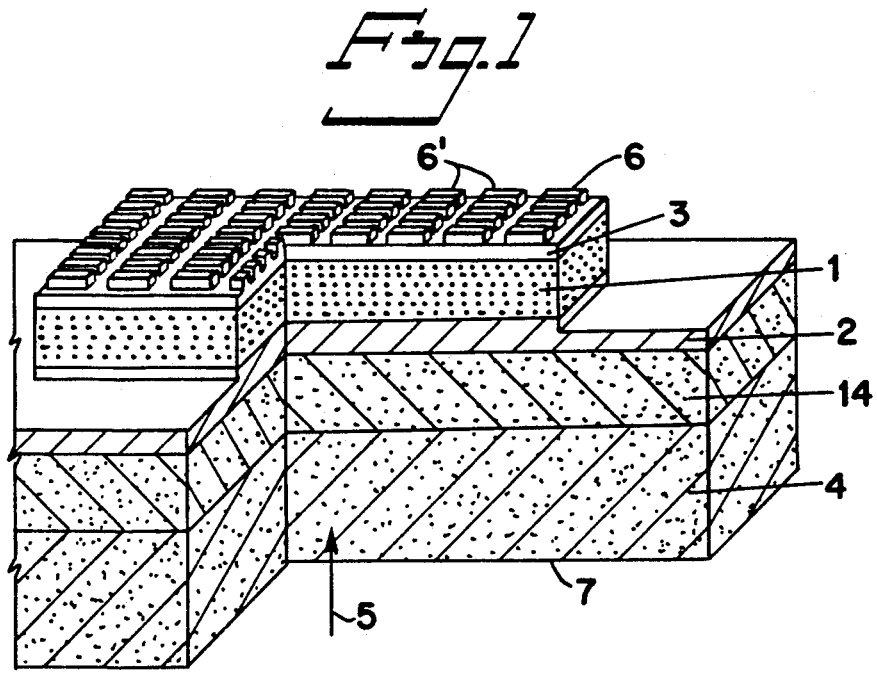
FIG. 1 is a perspective, partially cut-away view of a detector in which the invention is employed.

FIG. 1 illustrates a detector in which the invention is applied. The detector is an infrared detector which functions to detect infrared radiation. The detector is of the kind which uses quantum wells, said wells comprising thin layers of, e.g., gallium arsenide (GaAs) surrounded by aluminium gallium arsenide (AlGaAs). In FIG. 1, the reference numeral 1 identifies a multiple of such quantum-well layers. For instance, the layer may comprise 50 thin layers of GaAs and AlGaAs which together have a thickness of 1.7 micrometers. A respective contact layer 2 and 3 is provided beneath and above the quantum-well layer. The detector is built-up on a substrate 4 of semi-insulating gallium arsenide (GaAs). Incident light is intended to impinge from beneath in FIG. 1, as shown by the arrow 5.

In accordance with the invention, there is provided a two-dimensional reflection grating 6, a so-called crossed grating or doubly-periodic grating with a plurality of projecting bodies 6', on the top of the detector mesa 1 of the detector, i.e. on the quantum-well structure of the detector, on the side opposite to that surface 7 through which incident light 5 is intended to enter the detector. The reflection grating is comprised, for instance, of etched gallium arsenide with an overlying metal layer thereby providing a pattern of reflective cavities. The grating 6 is intended to spread the incident light in different directions.

The grating is constructed so as to spread light in four directions, namely (1,0), (−1,0) (0,1) and (0, −1). These directions are designated (1 0)—directions in the following. In order to achieve good absorption, it is optimum to lie close to the so-called cutoff of these directions, where the spread angle is close to 90° and the wavelength in vacuum is equal to $N \times d$, where N is the refraction index and d is the grating constant.

However, the spread radiation may either be TE (transverse electric) with the electric field vector lying parallel with the quantum well plane and the grating plane. There is no quantum-well absorption in this case. Alternatively, the field vector may be directed perpendicularly to this direction, i.e. TM (transverse magnetic), in which case quantum-well absorption will take place. The dimensions of the crossed grating can be chosen by the skilled person so that spread radiation with TM-polarization is enhanced at the cost of radiation with TE-polarization, which optimizes absorption.

Furthermore, reflexes with the order (0 0) can be minimized since this does not give rise to absorption either.

Figure 2:
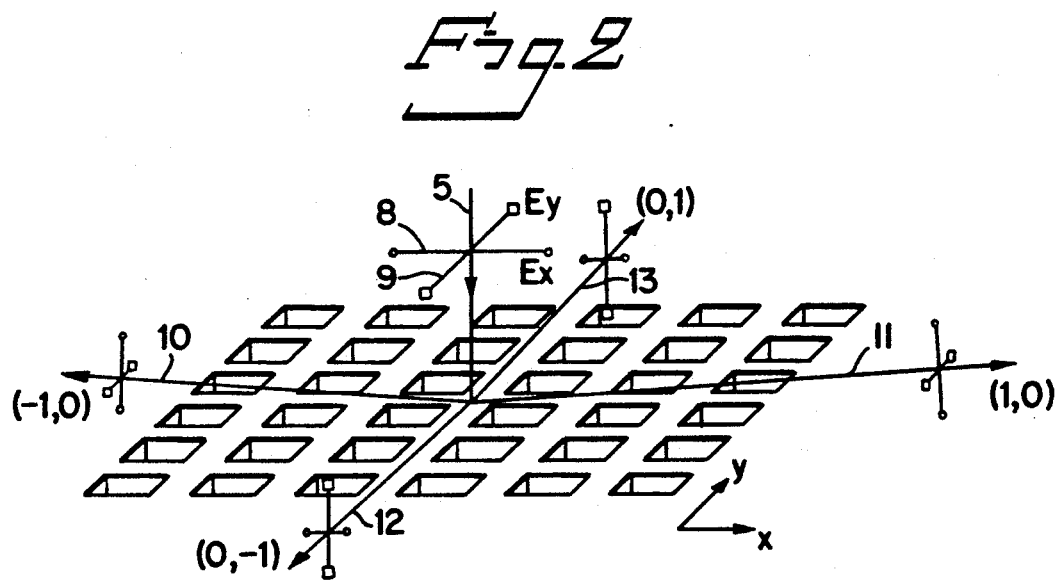
FIG. 2 is an explanatory drawing, in which the grating shown in FIG. 1 is illustrated from beneath.

The aforedescribed is illustrated in FIG. 2, which shows the grating from beneath and which indicates the direction of incident light with the arrow 5. Incident light or radiation may be non-polarized or polarized. In both cases, the electric field can be divided into an x-component (Ex), which is indicated by a solid line 8 between two solid circles, and a y-component (Ey) which is indicated with a solid line 9 between two hollow squares. The magnitude and direction of the electric field are given respectively by the length and the direction of the solid lines.

As also shown in FIG. 2, the incident radiation, whose field vector is parallel with the grating plane, is converted by the influence of the grating so that a large component TM-radiation, where the field vector is perpendicular to the grating plane, is formed and thus give rise to absorption; see the beams 10, 11 and 12, 13. In the case of the spread light, the electrical fields originating from the x-direction 10, 11, of the incident radiation are shown as such, i.e. with a solid line between two solid circles, whereas the electric fields originating from the y-direction 12, 13, are shown with a solid line between two hollow squares.

In this way, the grating couples the incident radiation effectively to the quantum wells through said reflection.

Consequently, the grating renders the detector insensitive to how the incident radiation is polarized.

According to one preferred embodiment, the crossed grating is configured with square (quadrangular) or hexagonal symmetry of the projecting bodies. This renders the detector totally insensitive to the polarization of the incident light.

It can be shown that the precise form of the grating profile is not critical in obtaining a high degree of quantum efficiency.

For example, the grating may consist of parallelepipedic bodies 6', as illustrated in FIG. 1, measuring 0.9×2.1×2.1 micrometers.

Figure 4:
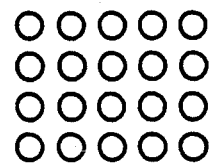
FIGS. 4 and 5 are diagramatic plan views illustrating two dimensional crossed gratings with bodies arranged in square symmetry, using bodies, respectively, of circular cross-section and of square cross-section.
Figure 5:
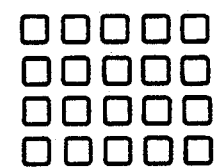
Figure 6:
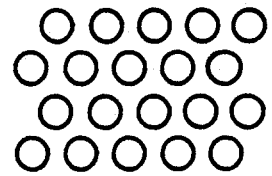
FIGS. 6 and 7 are diagramatic plan views illustrating two dimensional crossed gratings with bodies arranged in hexagonal symmetry, using bodies, respectively, of circular cross-section and of square cross-section.
Figure 7:
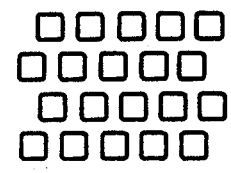

The grating, however, as shown diagramatically in FIGS. 4 and 6 may alternatively comprise circular bodies in the plane of the grating, or bodies of some other shape as in FIGS. 5 and 7.

Although not shown, a metal layer is provided above the grating for reflecting the incident light that falls onto the grating back onto the quantum-well layer 1. This layer will be a good conductor, for instance a gold, silver or aluminium layer.

Figure 3:
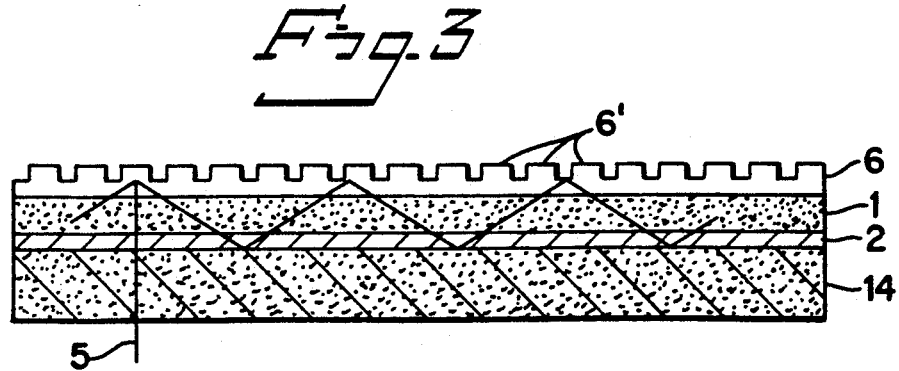
FIG. 3 is a cross-sectional view of a structure according to FIG. 1.

According to one most preferred embodiment, a so-called cladding layer 14, i.e. a mirror having a low refraction index, is mounted beneath the quantum-well structure 1. This layer may be an aluminium arsenide layer or, alternatively, an aluminium gallium arsenide layer. The layer 14 has a low refraction index, which gives total reflection. FIG. 3 illustrates how incident light or radiation 5 is reflected onto the grating 6 and onto the cladding layer 14, causing the light to pass through the quantum wells a number of times, thereby greating increasing the degree of quantum efficiency. Thus, it is highly preferable to combine the grating with said cladding layers. The grating and the cladding layer therewith define a waveguide. The cladding layer may have a thickness of 3 micrometers for instance.

According to an alternative embodiment there is no layer corresponding to the said layer 14, but the mirror consists of the ambient atmosphere, where the refraction index of the atmosphere gives total reflection. The atmosphere can for example be air or any other suitable gas.

According to this embodiment there is no cladding layer 14 and there is no substrate 4. Instead the control layer 2 forms the underside. However, a thin layer of gallium arsenide (AlGaAs) can be applied on the contact layer 2, which layer of AlGaAs then forms the underside of the structure.

A degree of quantum efficiency as high as 80–90% is obtained with the described method and arrangement.

The reflection grating 6 together with the cladding layer 14 also greatly reduces the occurrence of so-called cross-talk between adjacent detector elements in an array of such elements.

It is obvious that the present invention solves the problems mentioned in the introduction.

A number of exemplifying embodiments have been described in the aforegoing. It will be understood, however, that the arrangement can be modified with respect to material, the configuration of the grating, etc., without departing from the inventive concept of using a grating to enhance the degree of quantum efficiency. The present invention shall not therefore be considered restricted to the aforedescribed and illustrated exemplifying embodiments thereof, since modifications can be made within the scope of the following claims.

We claim:

1. A method for coupling radiation in an infrared detector of the kind that uses quantum wells which comprise epitaxial layers of gallium arsenide (GaAs) surrounded by aluminium gallium arsenide (AlGaAs), the quantum wells being a mesa with top and bottom surfaces, the method comprising: the step of placing a two-dimensional reflection crossed grating (6) with a plurality of reflective crossed grating bodies, on the top surface of the mesa of the quantum wells, the grating bodies projecting away from said top surface of the mesa, the bottom surface being the surface through which incident light (5) is intended to enter the detector; the step of passing incident light through the bottom surface and into and through said quantum wells and causing said incident light to impinge and reflect from the underside of the reflection crossed grating (6), and to thereby provide the step of spreading radiation of the incident light in a plurality of different reflected directions through the quantum wells to optimize quantum well absorption.

2. A method according to claim 1, wherein the crossed grating bodies provide the step of spreading light in four (1 0)-directions, close to the cut-off of said (1 0)-directions, so that the spread angle is close to 90°.

3. A method according to claim 1, including providing a cladding layer mirror of low refraction index on the opposite side, bottom surface, of the quantum-well structure (1) from the crossed grating.

4. A method according to claim 1, including the step of making the crossed grating (6) with a quadrangular symmetry of the grating bodies.

5. A method according to claim 1, wherein the crossed grating is made with a hexagonal symmetry of the grating bodies.

6. An infrared detector for detecting infrared radiation, said detector comprising a quantum wells mesa which is comprised of multiple epitaxial layers of infrared responsive semi-conductor material, with top and bottom surfaces, and a two-dimensional reflection crossed grating (6), which is a doubly periodic crossed grating coupler having grating bodies with reflective surfaces, disposed on the top surface of the mesa of the detector, which is the side opposite to the bottom surface through which incident light (5) is intended to enter the quantum wells mesa, said crossed grating spreading the incident light in a plurality of different directions back into the semi-conductor quantum wells to optimize quantum well absorption of the incident light.

7. An infrared detector according to claim 6, wherein the crossed grating (6) is constructed to spread light in four (1 0)-directions, close to the cut-off of the (1 0)-directions, where the spread angle is close to 90°.

8. An infrared detector according to claim 6, wherein a cladding layer (14), which is a mirror of low refraction index, is provided on the bottom surface of the quantum-wells mesa (1).

9. An infrared detector according to claim 6, wherein the crossed grating (6) is constructed with square symmetry of the grating bodies.

10. An infrared detector as defined in claim 6, wherein said multiple epitaxial layers of semiconductor material are epitaxial layers of gallium arsenide (GaAs) surrounded by epitaxial layers of aluminum gallium arsenide (AlGaAs).

11. An infrared detector as defined in claim 6, wherein said two-dimensional reflection grating is a crossed grating made from gallium arsenide, etched to form a crossed grating configuration, and an overlying reflective metal layer is provided over the crossed grating bodies resulting in the reflective cavities to reflect incident light impinging on the detector from beneath the crossed grating.

12. An infrared detector as defined in claim 11, wherein said reflective metal layer is gold.

13. An infrared detector as defined in claim 11, wherein said reflective metal layer is silver.

14. An infrared detector as defined in claim 11, wherein said reflective metal layer is aluminium.

15. An infrared detector according to claim 6, wherein the crossed grating is constructed with hexagonal symmetry of the grating bodies.

* * * * *